US009640696B2

(12) United States Patent
Gerster (10) Patent No.: US 9,640,696 B2
(45) Date of Patent: May 2, 2017

(54) CONCENTRATING PHOTOVOLTAIC CELL ARRAY (71) Applicant: SOITEC SOLAR GMBH, Freiburg (DE)

(72) Inventor: Eckart Gerster, Freiburg (DE)

(73) Assignee: SOITEC SOLAR GMBH, Freiburg (DE)

( * ) Notice: Subject to any disclaimer, the term of this patent is extended or adjusted under 35 U.S.C. 154(b) by 0 days.

(21) Appl. No.: 14/361,149

(22) PCT Filed: Dec. 7, 2012

(86) PCT No.: PCT/EP2012/005069
§ 371 (c)(1),
(2) Date: May 28, 2014

(87) PCT Pub. No.: WO2013/083283
PCT Pub. Date: Jun. 13, 2013

(65) Prior Publication Data
US 2014/0299176 A1 Oct. 9, 2014

(30) Foreign Application Priority Data

Dec. 8, 2011 (DE) .................... 20 2011 108 836 U
Dec. 23, 2011 (DE) .................... 20 2011 109 424 U (51) Int. Cl.
*H02N 6/00* (2006.01)
*H01L 31/042* (2014.01)
(Continued)

(52) U.S. Cl.
CPC ........ *H01L 31/0524* (2013.01); *H01L 31/044* (2014.12); *H01L 31/048* (2013.01);
(Continued)

(58) Field of Classification Search
CPC ........... H01L 31/02008; H01L 31/0504; H01L 31/188; H01L 31/02002; H01L 31/02005;
(Continued)

(56) References Cited

U.S. PATENT DOCUMENTS 4,834,805 A 5/1989 Erbert
6,248,948 B1 * 6/2001 Nakagawa et al. ........... 136/244
(Continued)

FOREIGN PATENT DOCUMENTS

DE 102006007472 A1 8/2007
DE 102009044610 A1 5/2011
(Continued)

OTHER PUBLICATIONS

International Search Report for International Application No. PCT/EP2012/005069 dated May 8, 2013, 4 pages.
(Continued)

*Primary Examiner* — Eli Mekhlin
(74) *Attorney, Agent, or Firm* — TraskBritt (57) ABSTRACT Apparatus for the industrial wiring and final testing of photovoltaic concentrator modules, consisting of a module frame, a lens disc, a sensor carrier disc and an electrical line routing arrangement, comprising the following features: a) a laser contact-making device for the contactless connection of connecting lines between the individual sensors and of connecting elements and of collective contact plates, wherein the line routing arrangement on the sensor carrier disc as basic structure has, in each case, five CPV sensors connected in parallel, and these parallel circuits are connected in series, b) a device for testing electrical properties, wherein a specific voltage is applied to CPV sensors themselves, and the light emitted by them via the lenses is detected and assessed, c) a device for testing tightness of finished concentrator modules, wherein compressed air is
(Continued)

applied to the modules in the interior and the emission of compressed air is checked.

15 Claims, 8 Drawing Sheets (51) Int. Cl.
 *H01L 31/052* (2014.01)
 *H01L 31/05* (2014.01)
 *H01L 31/054* (2014.01)
 *H01L 31/18* (2006.01)
 *H01L 31/044* (2014.01)
 *H01L 31/048* (2014.01)
(52) U.S. Cl.
 CPC ........ *H01L 31/052* (2013.01); *H01L 31/0504* (2013.01); *H01L 31/0543* (2014.12); *H01L 31/188* (2013.01); *Y02E 10/52* (2013.01); *Y10T 29/49826* (2015.01)
(58) Field of Classification Search
 CPC ......... H01L 31/02016; H01L 31/02019; H01L 31/05; H01L 31/052
 See application file for complete search history.

(56) References Cited

U.S. PATENT DOCUMENTS

| 2002/0148497 | A1* | 10/2002 | Sasaoka | F24J 2/067 136/243 |
| 2004/0144043 | A1* | 7/2004 | Stevenson et al. | 52/173.3 |
| 2008/0210286 | A1* | 9/2008 | Ball | H01L 31/02021 136/244 |
| 2009/0126794 | A1 | 5/2009 | Dimroth et al. | |
| 2009/0188551 | A1* | 7/2009 | Hwang | 136/255 |

FOREIGN PATENT DOCUMENTS

| DE | 102010016675 A1 | 11/2011 |
| WO | 2004066324 A2 | 8/2004 |
| WO | 2011076418 A2 | 6/2011 |

OTHER PUBLICATIONS

International Written Opinion for International Application No. PCT/EP2012/005069 dated May 8, 2013, 5 pages.
International Preliminary Report on Patentability for International Application No. PCT/EP2012/005069 dated Jun. 10, 2014, 6 pages.

* cited by examiner

CONCENTRATING PHOTOVOLTAIC CELL ARRAY

CROSS-REFERENCE TO RELATED APPLICATIONS

This application is a national phase entry under 35 U.S.C. §371 of International Patent Application PCT/EP2012/005069, filed Dec. 7, 2012, designating the United States of America and published in English as International Patent Publication WO 2013/083283 A1 on Jun. 13, 2013, which claims the benefit under Article 8 of the Patent Cooperation Treaty and under 35 U.S.C. §119(e) to German Patent Application Serial No. 20 2011 109 424.7, filed Dec. 23, 2011, and to German Patent Application Serial No. 20 2011 108 836.0, filed Dec. 8, 2011, the disclosure of each of which is hereby incorporated herein in its entirety by this reference.

TECHNICAL FIELD

Apparatus for the industrial wiring and final testing of photovoltaic concentrator modules, consisting of a module frame, a lens disc, a sensor carrier disc and an electrical line routing arrangement.

BACKGROUND

In photovoltaics, for many years, there have already been approaches for working with concentrated solar radiation. In this case, the radiation from the sun is concentrated by means of mirrors and/or lenses, and directed onto specific concentrator solar cells. Corresponding systems of concentrating photovoltaics (CPVs) are currently being tested in the Spanish Solar Research Institute (Instituto de Sistemas Fotovoltaicos de Concentracion (ISFOC)) in Castile at Puertollano. They concentrate the sunlight using lenses or mirrors to four hundred- to thousand-fold intensity before it impinges on small solar cells, which are significantly more efficient than traditional silicon solar cells.

In this respect, the following prior art is cited from the patent literature.

U.S. Pat. No. 4,834,805 discloses a photovoltaic power module, substantially comprising the following features:

An arrangement of photovoltaic semiconductor crystal cells, distributed in individual cell locations in a layered substrate, wherein these are enclosed by two electrically conductive layers and separated by means of an insulating layer. Furthermore, this module consists of a light-conveying layer composed of lenses, which is arranged at a distance from the layered substrate, wherein incident radiation is focused into the substrate in the light-conveying layer by means of the lens, and wherein the total thickness of the lens layer, of the substrate layer and of the space therebetween is approximately 2 inches.

DE 10 2006 007 472 A1 discloses a photovoltaic concentrator module comprising a lens plate and a baseplate, on which solar cells are accommodated, and a frame, wherein the frame connecting the lens plate and the baseplate is arranged circumferentially along the edge of the lens plate and the baseplate.

This known concentrator module is intended to be improved to the effect that it can be produced cost-effectively, has a long service life, and allows simple and flexible integration of additional components that cannot be accommodated, or can be accommodated only with difficulty, on the lens plate or the baseplate. Furthermore, the intention is to develop a method that makes it possible to produce such concentrator modules.

The problem stated here is solved by virtue of the fact that along the frame between the lens plate and the frame and/or the baseplate and the frame, firstly, at least one first sealing compound and/or adhesive compound and, secondly, at least one second sealing compound are arranged circumferentially at least on part of the length of the frame, wherein the two sealing and/or adhesive compounds differ with regard to their curing time and/or gas permeability.

Claim 57, of the above-mentioned document, claims a method for producing a photovoltaic concentrator module according to any of the preceding claims, which is characterized by the following features:

Namely, that a frame connecting a lens plate and a baseplate is arranged along the edge of the lens plate and the baseplate, and that between the frame and the lens plate and/or the frame and the baseplate firstly at least one first sealing compound and/or adhesive compound and secondly at least one second sealing compound are introduced circumferentially along the frame over at least part of its length, wherein the two sealing and/or adhesive compounds differ with regard to their curing times and/or gas permeabilities.

The fact that one of the adhesive compounds serves for fixing a plate during the production process by means of UV light cannot be inferred here.

DE 10 2010 016 675 A1 describes a photovoltaic module, a method for electrically connecting a plurality of photovoltaic cells and a device for electrically connecting a plurality of photovoltaic cells.

In accordance with Claim 11 of the abovementioned document, a method for electrically connecting a plurality of photovoltaic cells is claimed here, wherein the method comprises the following features:

1) applying a first plurality of contact wires on a front side of a first photovoltaic cell,
2) applying a second plurality of contact wires on a rear side of the first photovoltaic cell,
3) applying the first plurality of contact wires on a rear side of a second photovoltaic cell, and
4) applying the second plurality of contact wires on a front side of the second photovoltaic cell, wherein
5) the first plurality of contact wires and the second plurality of contact wires are arranged in a manner offset with respect to one another.

As an indication similar to the problem, it can be inferred from DE 10 2010 016 675 A1 that the intention is to create an improved photovoltaic module, that is to say, that the contact structure of the photovoltaic cell and the number and dimensioning of the contact ribbons (contact wires) are optimized in combination.

DISCLOSURE

The CPV solar cell array according to the invention addresses the problem of optimizing the electrical connection between solar cell assemblies (SCAs).

This problem is achieved with the CPV cell array and the CPV solar cell module according to the embodiments disclosed herein.

With the electrical connections as established in the CPV cell array according to the invention, the amount of necessary connections can be reduced and their respective lengths optimized to reduce power losses in the electrical connections between SCAs.

BRIEF DESCRIPTION OF THE DRAWINGS

The apparatus according to the invention is described in greater detail below. In this case, in the figures specifically.

DETAILED DESCRIPTION

Figure 1:
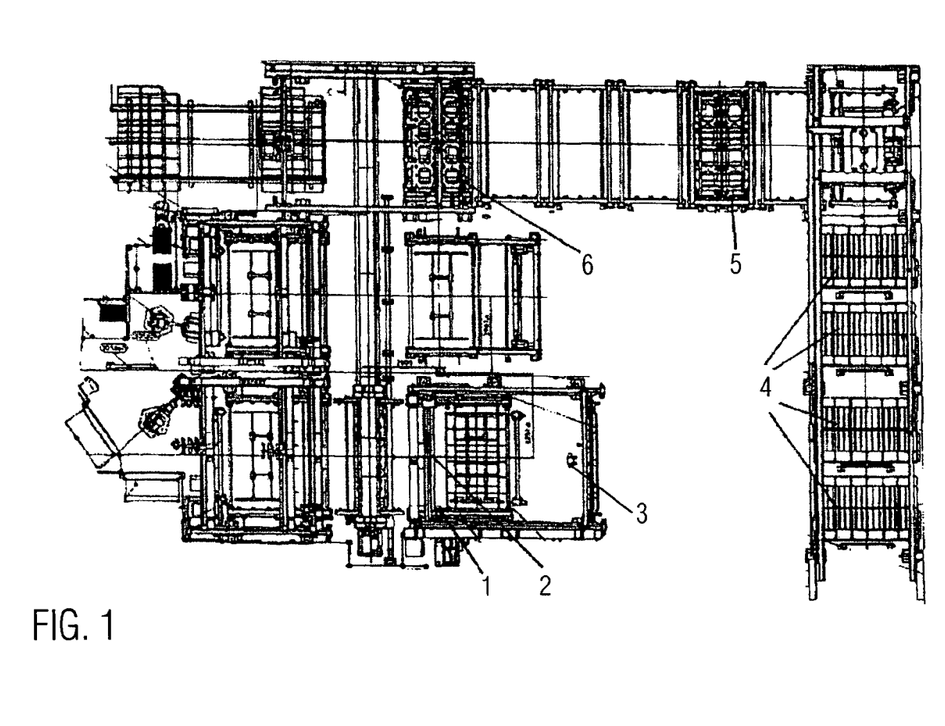
FIG. 1 shows an installation for manufacturing concentrator modules in plan view.
Figure 2:
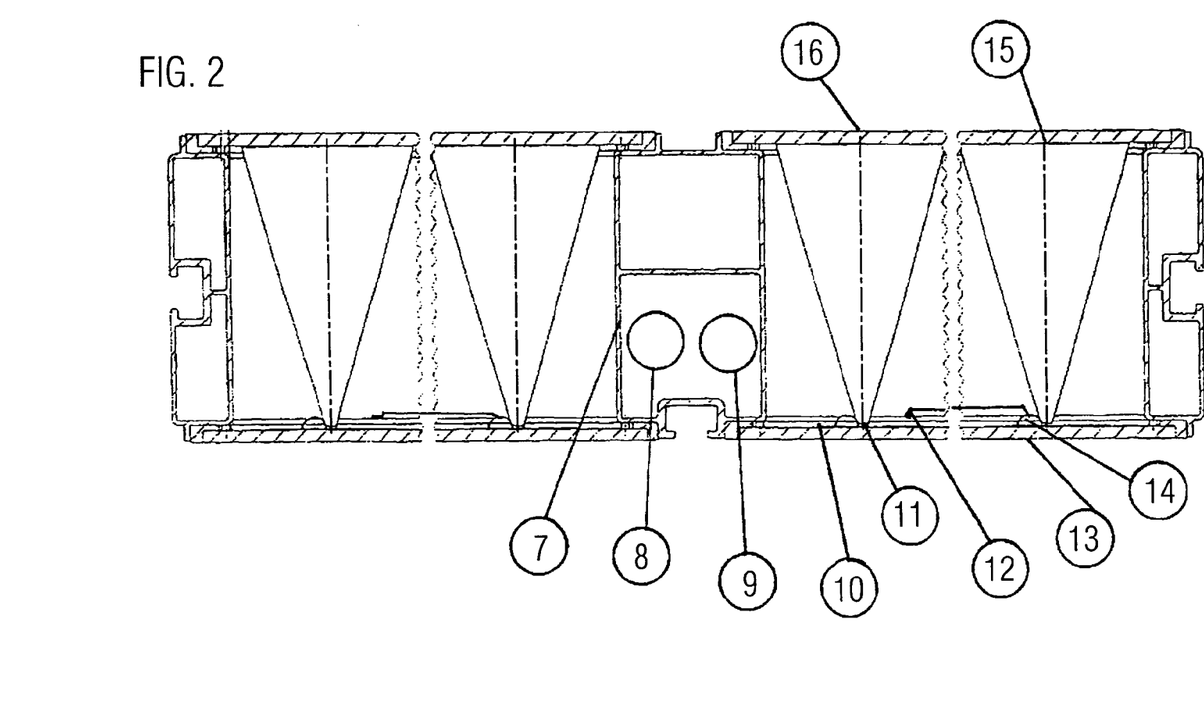
FIG. 2 shows a cross-section through a concentrator module.

FIG. 1 illustrates in plan view an installation for manufacturing concentrator modules, such as are shown in cross-section in FIG. 2.

However, only that part of the entire manufacturing installation that is provided with reference signs will be considered here. The manufacturing process until the time of wiring a concentrator module is not part of the invention.

At the time of wiring such a module, a sensor carrier disc 13 is already connected to the frame of the module and undergoes, in the next processing step after wiring, the connection to a lens disc 16 situated opposite and parallel to the sensor carrier disc 13. A laser gantry 2 carrying a laser head 1 is situated at a contact-making station 3 as depicted in FIG. 1. By means of the gantry 2, a module frame can be reached by the laser head 1 at any location with which contact is to be made.

A testing station 5 for the tightness test and a testing station 6 for the final electrical test will be described later.

Stacking stations 4 enable classification according to quality levels that are substantially determined by the results on the testing station 5 for the tightness test and the testing station 6 for the final electrical test.

FIG. 2 shows a cross-section through a concentrator module.

The cross-section reveals a concentrator module with its carrying module frame in cross-section in an enlarged illustration. Here, it is respectively possible to discern a lens disc 16 with a lens 15 on the top side and a sensor carrier disc 13 on the underside. In this case, the module frame is illustrated in a manner interrupted in its transverse extent on each side, in order to be able to show the details shown in the true size relationships. In the lens disc 16, indications of the Fresnel lenses 15 used are found on the right-hand side, and in the sensor carrier disc 13, there are the corresponding contact points 14 of the CPV sensors 11 and the associated contact points 12 with the cooling and contact plate 10. In addition, in this region, it is possible to discern a connecting line between a contact point 14 of the CPV sensor 11 illustrated on the right and a contact point 12—separated by the double scribed line—on the cooling and contact plate 10 of another CPV sensor 11, situated to the left of the first CPV sensor 11. It goes without saying that these two CPV sensors 11 are not directly connected to one another in practice, since they are separated by the double scribed line. A collective line 8 having negative polarity and a collective line 9 having positive polarity are illustrated in the region of a central web 7 of the concentrator module shown.

Figure 3A:
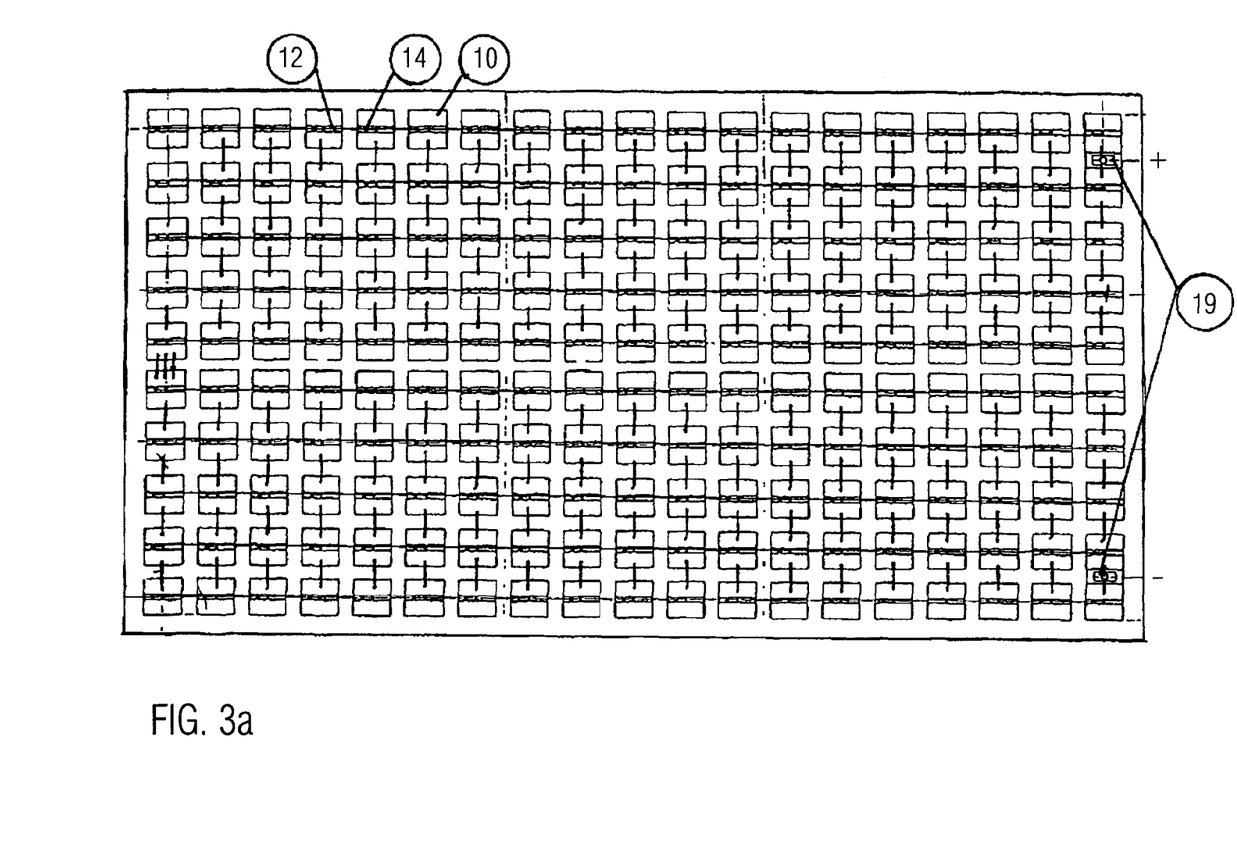
FIG. 3a shows a partial area of a sensor carrier disc.
Figure 4:
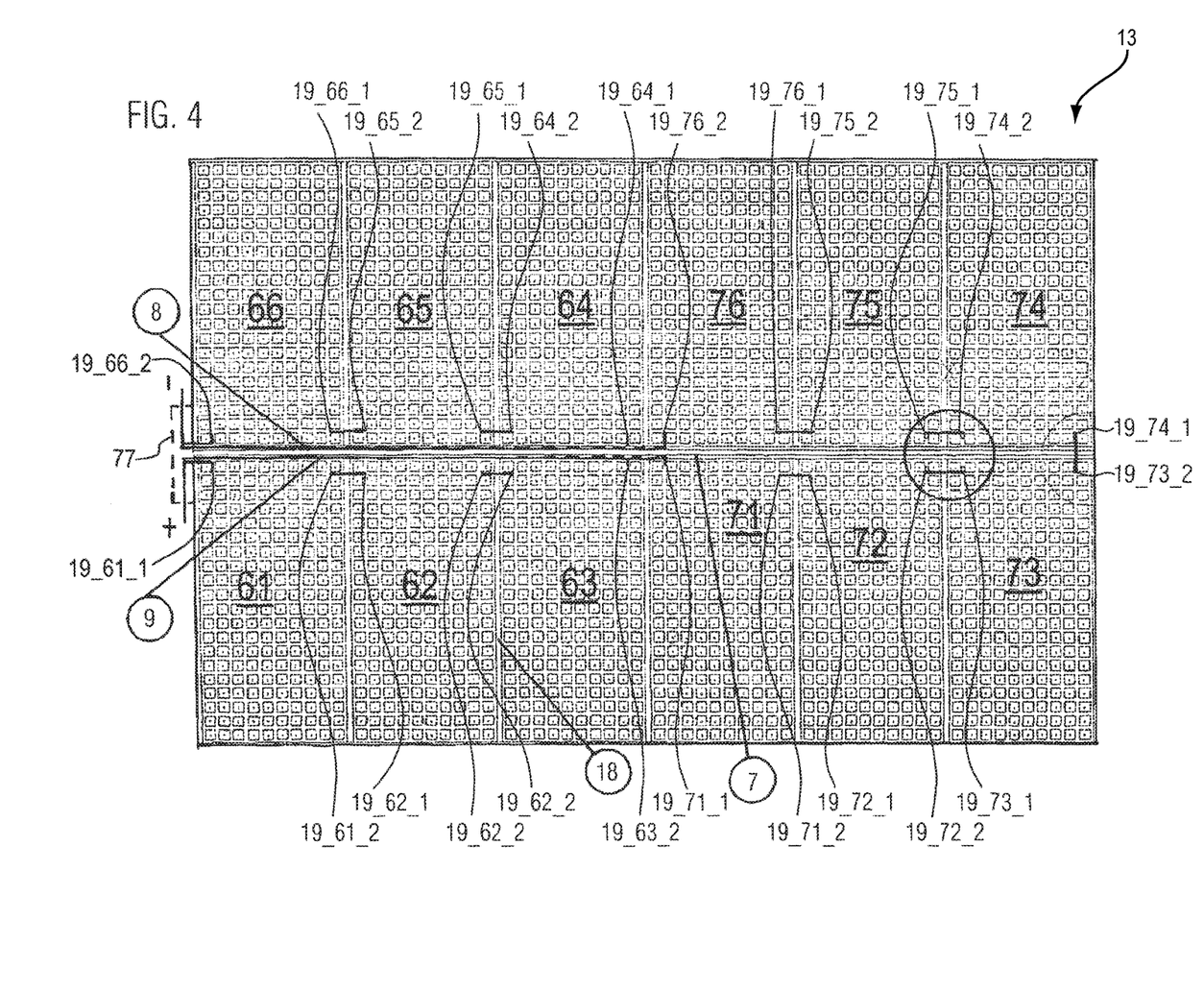
FIG. 4 shows a total area of a sensor carrier disc of a concentrator module.

FIG. 3a shows one of the twelve partial areas of a sensor carrier disc 13, such as can be seen overall in FIG. 4.

In the topmost row of the numerically nineteen CPV sensors 11 illustrated, by way of example, the cooling and contact plate 10, the contact point 12 on the contact plate 10 and the contact point 14 of the CPV sensor 11 on the sensor carrier disc 13 as seen from above are designated separately. On the right-hand side of the sensor carrier disc 13, the collective contact plate 19 having positive polarity can be discerned at the top and the collective contact plate 19 having negative polarity can be discerned at the bottom. For obtaining current, as a basic structure in each case, five CPV sensors are connected in parallel and these parallel circuits are in turn connected in series, such that the voltages of the parallel circuits add up. In the illustration shown in FIG. 3a, in this way, nineteen parallel circuits formed in each case, five CPV sensors are connected in series, and these extend over the longitudinal side of this partial area. However, since, on the partial area shown, a further five CPV sensors are situated on the broad side with the same number of parallel circuits, the voltages thereof add up here as well. Consequently, the sum of 2 times 19 respective parallel-connected arrangements of, in each case, five CPV sensors results as the summation voltage of the partial area shown in FIG. 3a. In this way, total voltages of up to 1,000 volts can be generated by the interconnection of 2 times 6 partial areas.

Figure 3B:
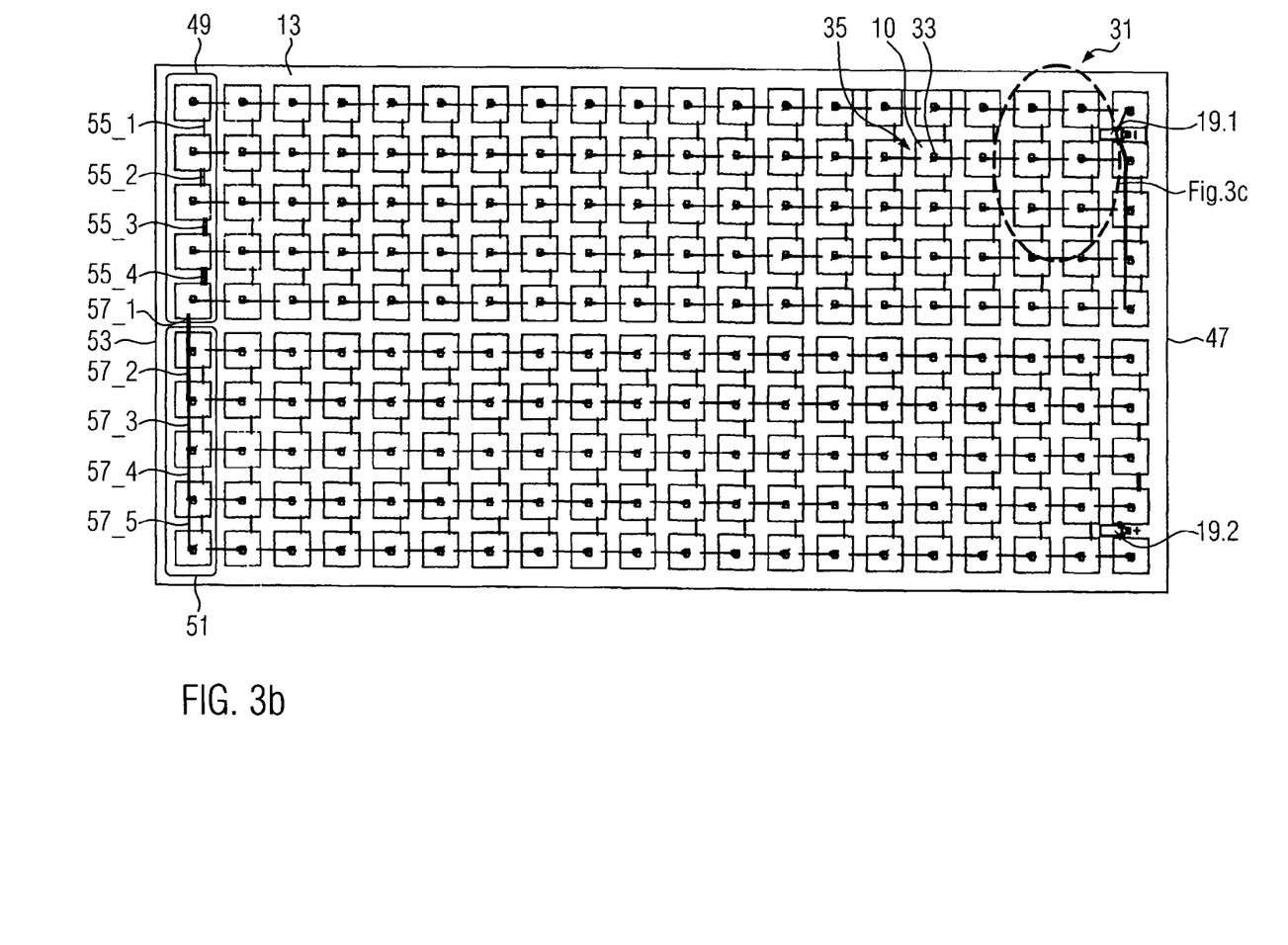
FIG. 3b shows a partial area of the sensor carrier disc in more detail.

FIG. 3b illustrates the partial area 12 as illustrated in FIG. 3a in more detail. The partial area 12 of FIG. 3a represents a CPV cell array 31 or CPV sensor array 31 comprising the CPV cells 33, also called CPV sensors (absorbers) in the description of FIG. 3a. Each one of the CPV cells 33 is positioned on its respective cooling and contact plate 10 and in electrical contact therewith. A CPV cell 33, together with its cooling and contact plate 10, forms a so-called solar cell assembly (SCA) 35. The SCAs, here in total 190 per CPV cell array 31, are placed on the glass plate, also called a sensor carrier disc 13 of a concentrator module in FIG. 2.

Figure 3C:
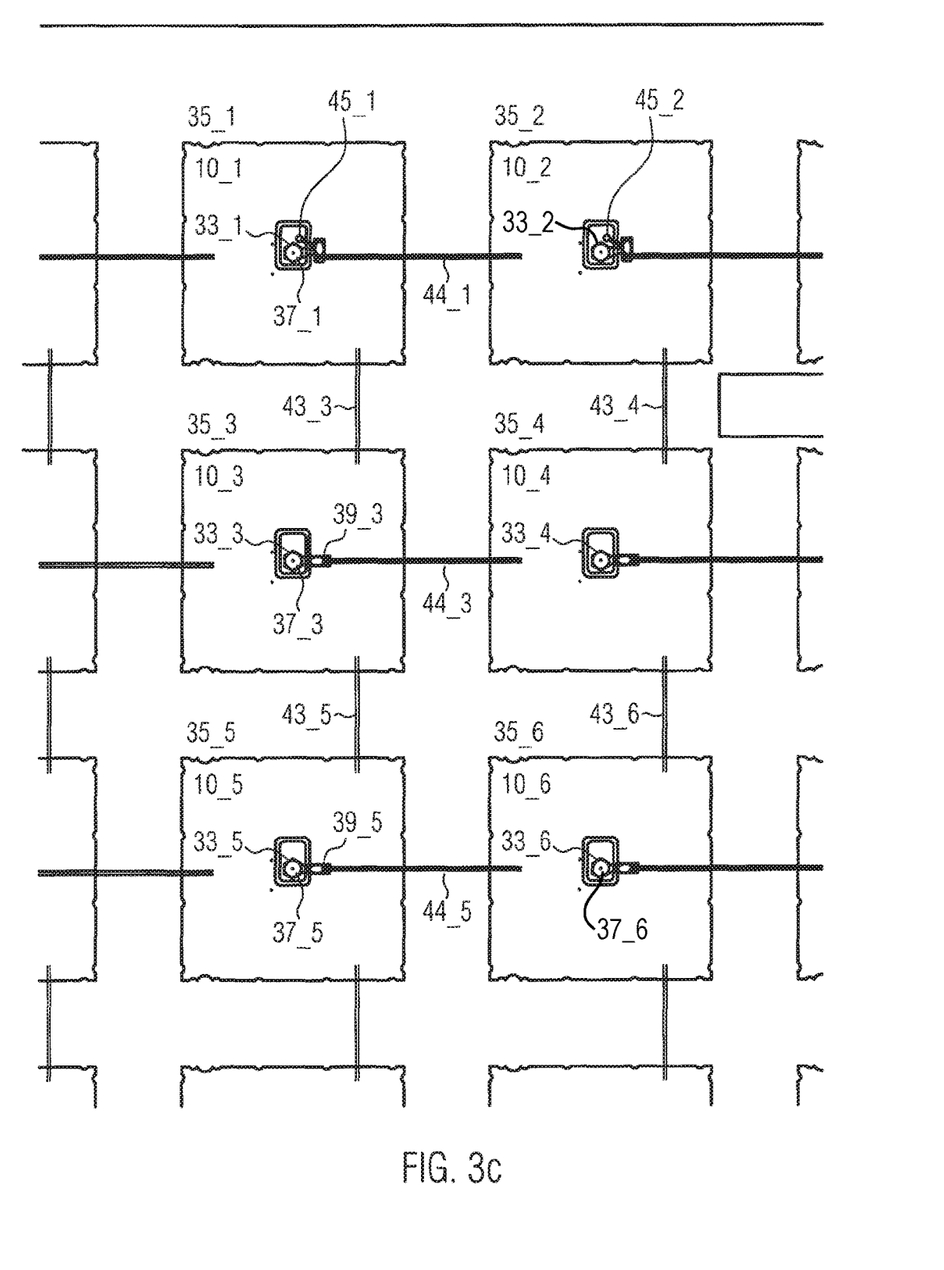
FIG. 3c shows a partial area of FIG. 3b in greater detail.

The SCAs 35 are interconnected with each other in a parallel and serial manner. FIG. 3c shows the interconnection in more detail. FIG. 3c shows six SCAs 35_1 to 35_6. CPV cell 33_5 is connected with its first pole 37_5, here the minus pole, via a contact pad 39_5, that is electrically isolated from the cooling and contact plate 10_5 and a connection 44_5 with the second pole 37_6 of opposite polarity, thus here the plus pole, of the neighboring SCA 35_6. The connection 44_5 terminates on the cooling and contact plate 10_6 of the SCA 35_6, which is in electrical contact with the second pole 37_6 of opposite polarity of the CPV cell 33_6. There is thus a serial connection toward SCA 35_6. This serial connection is already described in relation to FIG. 2.

Toward SCA 35_3, a parallel connection is established by linking the cooling and contact plates 10_5 and 10_3 with each other and thus the poles of opposite polarity, in this embodiment the plus poles, using connection 43_5. According to the invention, the connection between the first poles 37_5 and 37_3 of the first polarity, here the minus poles of the CPV cells 33_5 and 33_3, is not achieved via a direct connection but via a connection using the neighboring SCAs 35_4 and 35_6 and, in particular, the cooling and contact plates 10_4 and 10_6. The electrical connection of the first poles 37_5 and 37_3 is achieved via the electrical connection 44_5 of the first pole 37_5 with the cooling and contact plate 10_6, the electrical connection 43_6 between the cooling and contact plates 10_6 and 10_4, and the electrical connection 44_3 between the cooling and contact plate 10_4 and the first pole 37_3 of CPV cell 33_3.

The connecting schema as described above is repeated like this for most of the SCAs. Like already described above, the 190 SCAs are arranged such that five SCAs are connected in parallel, thereby forming two times nineteen series of five parallel connected SCAs.

In this embodiment, each series of parallel connected SCAs comprises one SCA with a bypass diode to prevent damaging of the solar cells in case of malfunctioning of one SCA or a series of parallel connected SCAs. In FIG. 3c, SCAs 35_1 and 35_2 comprise a bypass diode 45_1 and 45_2, respectively. The bypass diodes 45_1 and 45_2 are connected in parallel with the CPV cells 33_1 and 33_3, such that they are reverse biased when the CPV cells 33_1 and 33_3 are forward biased. In alternative embodiments, more than one bypass diode may be used in each series of parallel connected SCAs and even each SCA may comprise a bypass diode. Furthermore, one bypass diode may be connected in parallel to more than one SCA connected in series, e.g., one bypass diode for SCA 35_1 and 35_2.

The two times nineteen parallel connected SCA series are connected such that the collective contact plates 19 of opposite polarity 19_1 and 19_2 are positioned on one side, here the short side 47 of the rectangular-shaped CPV array 31. Therefore, the two parallel connected series 49 and 51 on the other side, here the other short side 53 of the CPV array 31, are connected in series. To take into account the increasing currents, the connections 55_1, 55_2, 55_3, 55_4, but also 57_5, 57_4, 57_3, 57_2, 57_1, become thicker and thicker, which is achieved by increasing the number of connections or by using a different conductor diameter or a different material.

Using the combination of parallel and series connection and, in particular, the parallel connection via the cooling and contact pads of the neighboring SCAs, the amount of electrical connections can be reduced, while at the same time, the connections between SCAs can be kept short. Thus, power losses can be reduced and a more cost-effective design is achieved.

FIG. 4 shows a sensor carrier disc 13 of a concentrator module. In the center of the sensor carrier disc 13, the central web 7 of the concentrator module shown, the web 7 being illustrated in cross-section in FIG. 2, can be discerned from above over the entire length. Equally, the second transverse web from the left of a total of five items of the concentrator module is designated by 18. The collective line 8 having negative polarity and the corresponding collective line 9 having positive polarity, as can also be gathered from FIG. 2 in cross-section, carry the current supplied overall by the concentrator module substantially from the geometrical center of the sensor carrier disc 13 to the edge into the region of a connection element. This element is not illustrated separately. At the right-hand edge of the transverse side of the sensor carrier disc 13 shown, a further collective contact plate is designated by 19. The circle enclosing the four corner points of the four partial areas of the sensor carrier disc 13 that are located on the right is reproduced in the enlargement in FIG. 5.

In the concentrator CPV module of FIG. 4, the twelve CPV solar arrays are interconnected such that two groups of two times three modules are connected. The six CPV solar arrays 61 to 66 are connected in series with their respective contact plates 19_61_1, 19_61_2, 19_62_1, . . . , 19_66_2 all facing the central web 7. The second group of CPV solar arrays 71 to 76 are also connected in series with their contact plates 19_71_1, 19_71_2, 19_72_1, . . . , 19_76_2 also facing the central web 7.

The terminals 19_61_1 and 19_66_2 at the extremities of the first group of CPV solar arrays 61 to 66 are brought into contact with a connection box 77 serving as the connector toward the exterior of the CPV module. The two groups of six CPV cell arrays are interconnected in parallel as can be seen from FIG. 4. The connecting box 77 is arranged on the one extremity of the central web 7.

The terminals 19_71_1 and 19_76_2 at the extremities of the second group of CPV solar arrays 71 to 76 are also brought into contact with the connection box 77 via the collective lines 8 and 9. The collective lines 8 and 9 collect the current essentially in the center of the module from the terminals 19_71_1 and 19_76_2.

Figure 5:
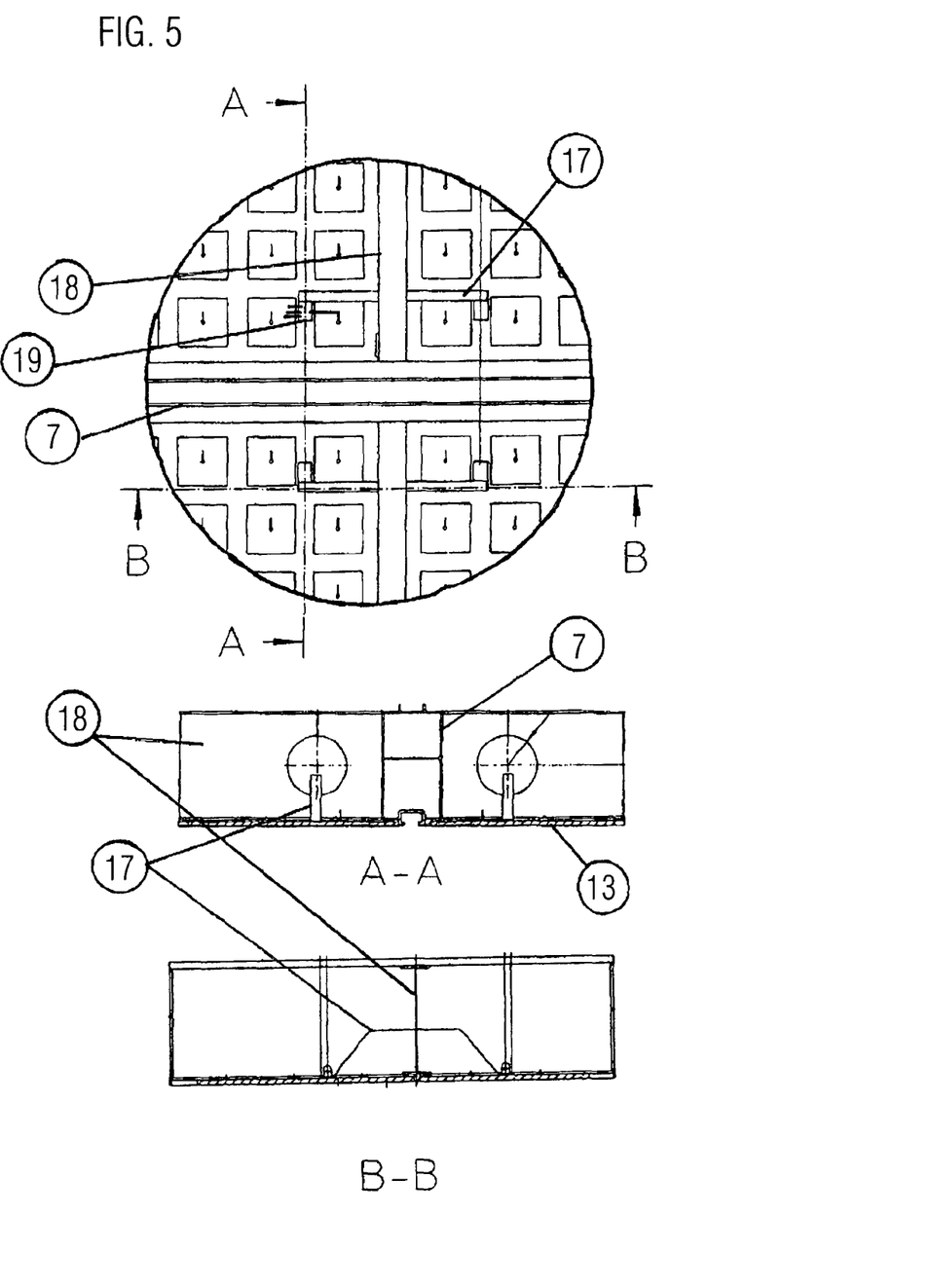
FIG. 5 shows a view of a partial aspect of FIG. 4.

FIG. 5 shows the identification circle known from FIG. 4 as a view of a partial aspect of FIG. 4. The identification circle reveals, in the center, the transversely running central web 7 of the concentrator module from FIG. 4. A transverse carrier 18, likewise visible from above, runs perpendicular to the central web 7. A respective connecting element 17 runs above and below the central web 7, parallel to the latter, and leads respectively from one collective contact plate 19 to another collective contact plate 19 of a partial area according to FIG. 3a. These collective contact plates 19 respectively carry the entire current of one of the twelve partial areas shown of the sensor carrier disc 13 and are, therefore, designed accordingly with regard to their loading capacity. The connecting elements 17 depicted altogether in FIG. 4 ensure the electrical series connection of all twelve partial areas.

The lower half of the drawing in FIG. 5 illustrates, in the section A-A, a cross-section transversely with respect to the central web 7 at a location with a view of the transverse carrier 18 illustrated in the identification circle. Here, a circular opening is shown besides the sensor carrier disc 13 and the central web 7 in the transverse carrier 18, respectively, to the left and right of the central web 7, a connecting element 17 in each case leading through the opening.

The cross-section B-B shown underneath correspondingly reveals a connecting element 17 with its bridge-shaped course, rotated by 90 degrees, in cross-section.

Figure 6:
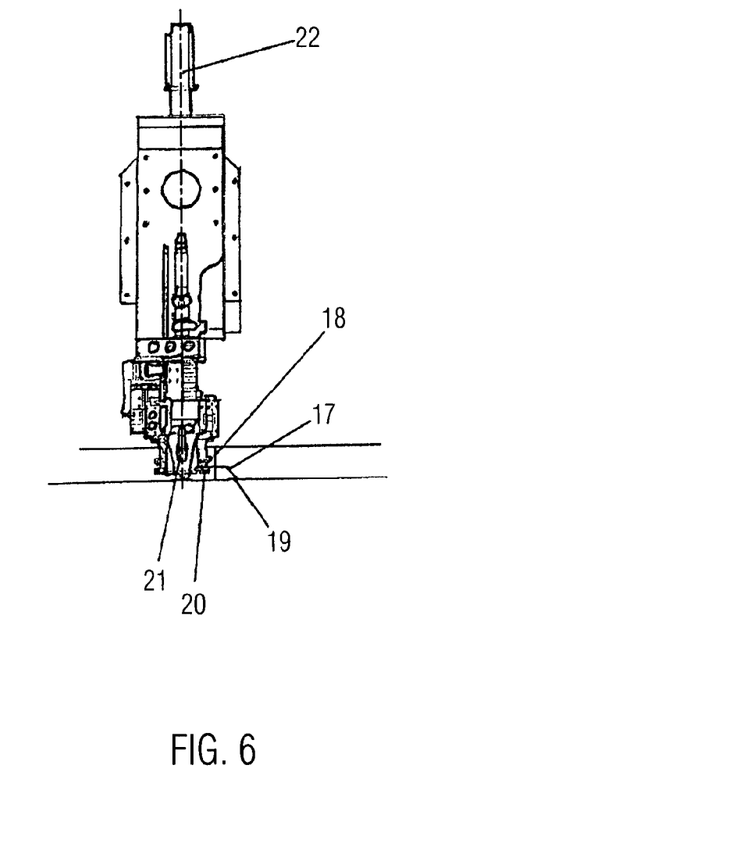
FIG. 6 shows a cross-section through the laser contact-making device used.

FIG. 6 shows a cross-section through the laser contact-making device used. The laser contact-making device ensures contactless, fast and secure contact-making as an electrical connection of two electrical conductors. The use of a laser in this region ensures that the two conductors to be connected are not touched by the connecting tool, and are heated only very briefly, and that they, therefore, virtually do not deform and can, therefore, be processed by means of automatic adjusting means. The laser contact-making device is guided and controlled by means of a receiving shaft 22 for a gantry carrier head. In the example shown, a connecting element is electrically conductively connected to a respective collective contact plate 19 by means of a gripper 20 and a laser 21.

For mounting the contact-making elements or contact-making partners to be connected by the laser contact-making device, corresponding holding means are provided, which are oriented to specific markings of the concentrator module in a laser-controlled manner. Their use is not illustrated separately.

After contact has been made with all required electrical connections and a lens disc 16 has been applied, the concentrator modules fabricated to that extent are fed to a device for testing electrical properties, wherein a specific voltage is applied to CPV sensors (11) themselves and the light emitted by them via the lenses (15) is detected and evaluated. If manufacturing faults are discovered in this region, repair can be effected manually or automatically.

After the final completion of a concentrator module, the concentrator modules are fed to a device for testing tightness (5), wherein compressed air is applied to them in the interior and the emission of compressed air is checked.

The control of the complex movement processes and the signal processing of the sensors used require a special closed-loop control.

LIST OF REFERENCE SIGNS

1 Laser head
2 Laser gantry
3 Contact-making station
4 Stacking stations
5 Testing station (tightness test)
6 Testing station (electrical)
7 Central web of a concentrator module
8 Collective line (negative pole)
9 Collecting line (positive pole)
10 Cooling and contact plate
11 CPV sensor (absorber)
12 Contact point on the plate 10
13 Sensor carrier disc of a concentrator module
14 Contact point of a CPV sensor (absorber)
15 Lens
16 Lens disc
17 Connecting element (ribbon or cable)
18 Transverse carrier
19 Collective contact plate
20 Gripper
21 Laser
22 Receiving shaft for gantry carrier head

The invention claimed is:

1. A concentrating photovoltaic (CPV) module, comprising:
   a lens disc comprising at least one lens for concentrating radiation; and
   a sensor carrier disc including at least one solar cell array having a plurality of solar cell assemblies (SCAs), each SCA of the plurality comprising at least a solar cell and a cooling and contact plate, the solar cell having a first contact pole of a first polarity and a second contact pole of an opposite second polarity, the solar cell mounted to the cooling and contact plate such that the second contact pole is in electrical contact with the cooling and contact plate;
   wherein the SCAs of the plurality are interconnected with each other to form a combination of parallel and serial connections, and wherein an indirect parallel connection between the first contact poles of the same polarity of a first SCA and a second SCA of the plurality is achieved via a third SCA and a fourth SCA of the plurality, the indirect parallel connection comprising:
      a first conductive element extending between the first contact pole of the first polarity of the first SCA and the second contact pole of the opposite second polarity of the third SCA of the plurality and providing a serial connection between the first SCA and the third SCA;
      a second conductive element extending between the second contact pole of the opposite second polarity of the third SCA and the second contact pole of the opposite second polarity of the fourth SCA of the plurality and providing a parallel connection between the third SCA and the fourth SCA; and
      a third conductive element extending between the second contact pole of the opposite second polarity of the fourth SCA and the first contact pole of the first polarity of the second SCA of the plurality and providing a serial connection between the fourth SCA and the second SCA.

2. The CPV module of claim 1, wherein the parallel connection between the second contact pole of the third SCA and the second contact pole of the fourth SCA of the plurality comprises an electrical conductor extending between the cooling and contact plate of the third SCA and the cooling and contact plate of the fourth SCA.

3. The CPV module of claim 2, wherein the SCAs of the plurality are arranged in a plurality of groups, each of the groups including two or more SCAs of the plurality of SCAs electrically interconnected in parallel, the groups electrically interconnected in series, one group of the plurality of groups comprising the first SCA and the second SCA, another group of the plurality of groups comprising the third SCA and the fourth SCA, each group of the plurality of groups comprising at least one bypass diode.

4. The CPV module of claim 3, wherein each of the groups comprises at least five SCAs of the plurality of SCAs.

5. The CPV module of claim 4, wherein the plurality of groups comprises at least thirty-eight groups.

6. The CPV module of claim 1, wherein the SCAs of the plurality are arranged in a plurality of groups, each of the groups including two or more SCAs of the plurality of SCAs electrically interconnected in parallel, the groups electrically interconnected in series, one group of the plurality of groups comprising the first SCA and the second SCA, another group of the plurality of groups comprising the third SCA and the fourth SCA, each group of the plurality of groups comprising at least one bypass diode.

7. The CPV module of claim 6, wherein each of the groups comprises at least five SCAs of the plurality of SCAs.

8. The CPV module of claim 7, wherein the plurality of groups comprises at least thirty-eight groups.

9. The CPV module of claim 1, wherein five SCAs of the plurality are connected in indirect parallel.

10. The CPV module of claim 1, wherein the SCAs of the plurality are arranged in at least thirty-eight groups, each of the groups including two or more SCAs of the plurality of SCAs electrically interconnected in parallel, the at least thirty-eight groups electrically interconnected in series, one group of the at least thirty-eight groups comprising the first SCA and the second SCA, another group of the at least thirty-eight groups comprising the third SCA and the fourth SCA.

11. The CPV module of claim 10, wherein the at least thirty-eight groups comprise a first set of nineteen of the groups of SCAs and a second set of nineteen of the groups, the first set and the second set positioned next to each other and connected in series on a first side of the solar cell array, the solar cell array further comprising collective contact plates of first and second polarity acting as terminals on a second side of the solar cell array opposite the first side of the solar cell array.

12. The CPV module of claim 1, wherein the sensor carrier disc comprises twelve solar cell arrays arranged in two rows of six solar cell arrays, and wherein a first group of six neighboring solar cell arrays of the twelve solar cell arrays are arranged in two rows of three solar cell arrays and connected in series, and wherein a second group of six neighboring solar cell arrays of the twelve solar cell arrays are arranged in two rows of three solar cell arrays and connected in series.

13. The CPV module of claim 12, wherein terminals of each of the twelve solar cell arrays face toward a central web.

14. The CPV module of claim 13, wherein terminals of the CPV module are located on one side of the CPV module at an extremity of the central web.

15. The CPV module of claim 14, further comprising collecting lines connecting the terminals of the solar cell arrays of at least one of the first and second groups of six solar cell arrays with the terminals of the CPV module, and wherein the collecting lines carry current supplied from the at least one of the first and second groups of six solar cell arrays substantially from a geometrical center of the CPV module.

* * * * *